July 29, 1969 J. R. McDANIEL 3,458,780

WEDGE BONDED LEADS FOR SEMICONDUCTOR DEVICES

Filed Sept. 27, 1967 2 Sheets-Sheet 1

July 29, 1969 J. R. McDANIEL 3,458,780

WEDGE BONDED LEADS FOR SEMICONDUCTOR DEVICES

Filed Sept. 27, 1967 2 Sheets-Sheet 2

WITNESSES:

Helen M. Farkas

Donald L. Winegar

INVENTOR

Joe R. McDaniel

BY

C. L. Menzemer

ATTORNEY

United States Patent Office 3,458,780

Patented July 29, 1969

3,458,780

WEDGE BONDED LEADS FOR SEMICONDUCTOR DEVICES

Joe R. McDaniel, Greensburg, Pa., assignor to Westinghouse Electric Corporation, Pittsburgh, Pa., a corporation of Pennsylvania Filed Sept. 27, 1967, Ser. No. 670,869
Int. Cl. H01l 5/02
U.S. Cl. 317—234 9 Claims

ABSTRACT OF THE DISCLOSURE

A solderless electrical connector assembly comprising a pin and a receptacle are utilized to make electrical connections in a semiconductor device. The pin has a wedge shaped, or tapered, end which fits into a cavity in the receptacle, the cavity being shaped to receive the wedge shaped end of the pin. An electrical connection between an electrical lead and the pin is accomplished by wedging the end portion of the electrical lead between the wedge shaped end of the pin and the cavity wall.

BACKGROUND OF THE INVENTION

Field of the invention

This invention relates to solderless electrical connector assemblies for semiconductor devices.

Description of the prior art

Heretofore, the method of electrically connecting electrical leads from a hermetically sealed semiconductor element to terminals for extended electrical connections is either soldering, welding or compression bonding. Vibration and thermal cycling may deteriorate some of the electrical connections and shorten the electrical device's lifetime. Additionally, assembly operations require separate operations for joining electrical leads to terminals, thence encapsulating the semiconductor elements and its leads, and then completing the hermetic sealing of the element and its leads by crimping the leads within tubes passing through the hermatic enclosure.

SUMMARY OF THE INVENTION

In accordance with the teachings of this invention there is provided a solderless electrical connector assembly for semiconductor devices comprising a pin, the pin comprising an electrically conductive material and having a wedge shaped end portion, and a receptacle, the receptacle having a cavity disposed therein and adapted to receive the wedge shaped end portion of said pin.

An object of this invention is to provide a solderless electrical connector assembly suitable for semiconductor devices.

Another object of this invention is to provide a solderless electrical connection by wedging an electrical lead between the wedge shaped end portion of the electrically conductive pin and the walls of the cavity of a connector shaped to receive the wedge shaped end of the pin, the pin having a force means exerted on it to maintain the electrical connection.

Another object of the invention is to provide a force means acting on the pin comprising the hermetic enclosure for the semiconductor device.

A still further object of the invention is to provide a force means acting on the pin comprising a resilient electrically conductive member disposed between and in contact with both the pin and the hermetic enclosure for the semiconductor device.

Other objects of this invention will, in part, be obvious and will, in part, appear hereinafter.

DRAWINGS

Figure 1:
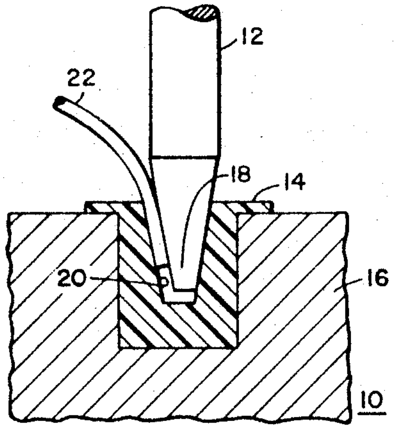
Figure 4:
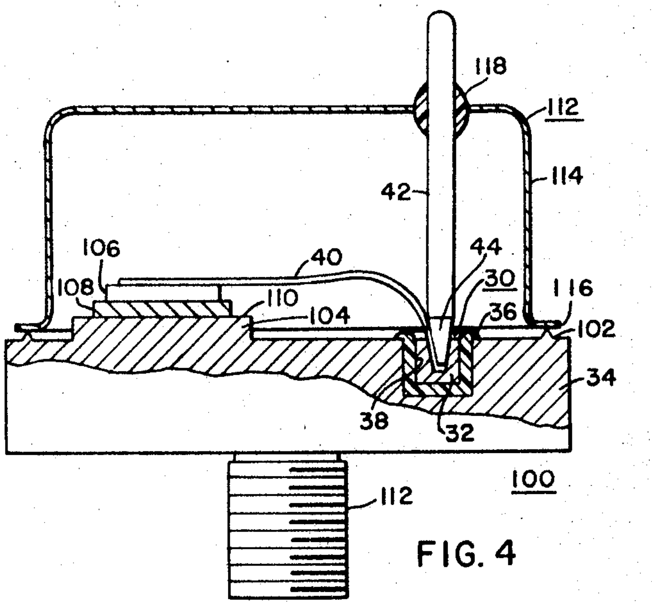
Figure 2:
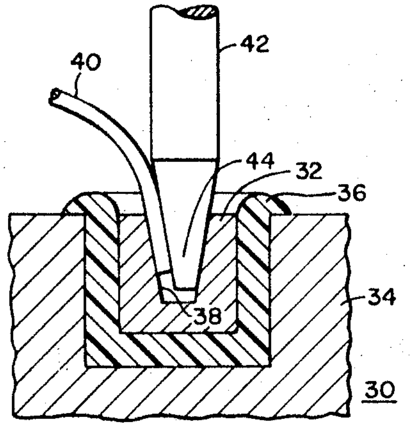
Figure 3:
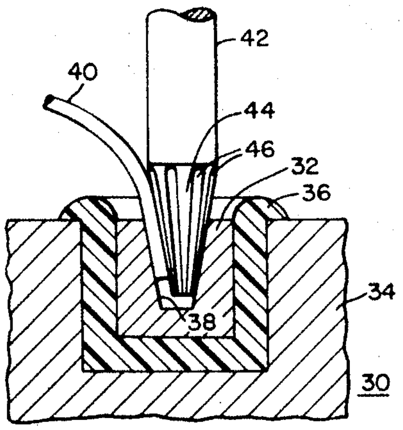
Figure 5:
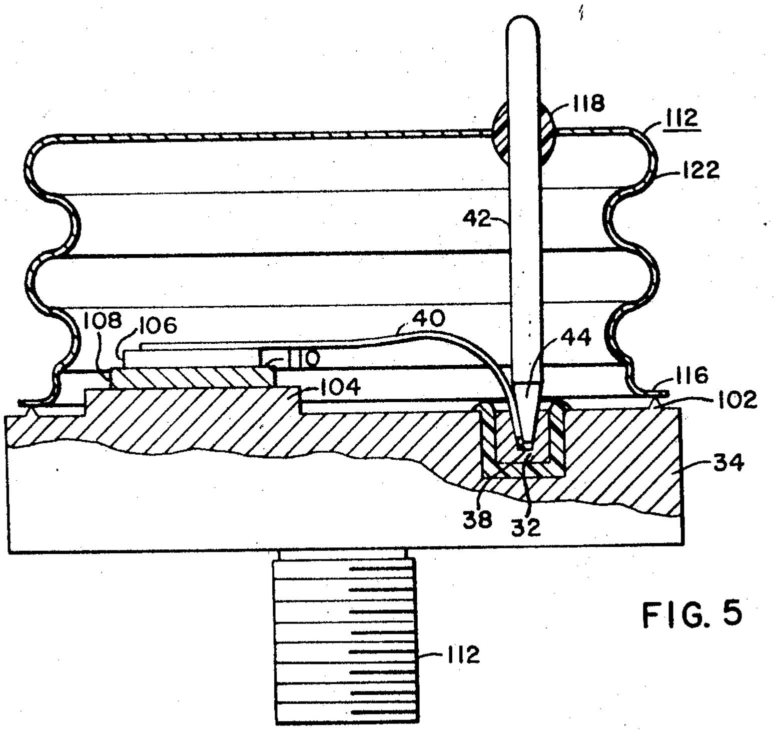
Figure 6:
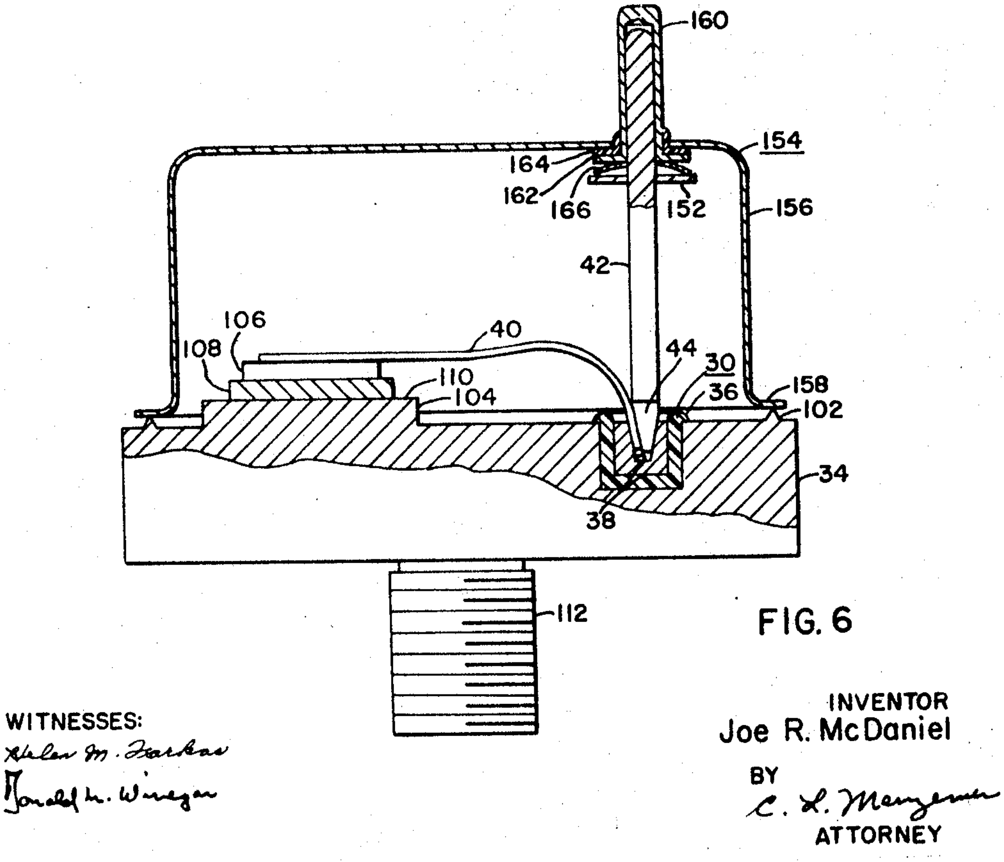

For a better understanding of the nature and objects of the present invention, reference should be had to the following drawings in which:

FIGS. 1, 2 and 3 are views, partly in cross-section, of solderless electrical connector assemblies embodying the teachings of this invention; and FIGS. 4, 5 and 6 are views, partly in cross-section, of electrical devices embodying solderless electrical connector assemblies made in accordance with the teachings of this invention.

DESCRIPTION OF THE INVENTION

With reference to FIG. 1, there is shown a solderless electrical connector assembly 10 suitable for employment in semiconductor devices. The assembly comprises a pin 12 and a receptacle 14. The receptacle 14 is disposed within a portion of a support member 16 of the semiconductor device embodying the assembly 10.

The pin 12 comprises any good electrically conductive metal member such, for example, as gold, silver, copper, aluminum, and base alloys of copper. The pin 12 must have enough strength to prevent collapsing under columnar loading. The pin 12 preferably has a wedge shaped, or tapered, end 18 which is inserted into the receptacle 14.

Since the support member 16 is usually employed as an electrical connection to one region of the semiconductor element disposed on the support member 16, the receptacle 14 comprises a suitable electrically insulating material. The material should, however, yield elastically or plastically, but it must have a low creep rate in order to retain the device's reliability. The receptacle 14 has a cavity 20 disposed therein, the side surfaces of which are tapered and conform to the tapered surface of the tapered end 18 of the pin 12.

In employing the solderless electrical connector assembly 10, an electrical lead 22 from the semiconductor element is inserted into the cavity 20. The tapered end 18 of the pin 12 is then inserted into the cavity 20 and forced downward toward the bottom of the cavity 20. The contiguous surface of the tapered end 18 and the cavity 20 guide the pin into the cavity 20 and a portion of the surface of the tapered end 18 becomes contiguous with a portion of the outer surface of the lead 22. Further movement of the pin 12 downward into the cavity 20 wedges the tapered end and the lead 22 together with the tapered surface confines of the cavity 20 establishing a good electrical contact between the pin 12 and the electrical lead 22. To enhance the electrical conductivity between the pin 12 and the lead 22, either the pin 12, the lead 22, or both, may be coated with a more electrically conductive material than that material comprising the major proportion of either the pin 12 or the lead 22.

With reference to FIG. 2, there is shown an alternate method of enhancing the electrical conductivity relationship between an electrical lead and the pin of a solderless electrical connector assembly. A solderless electrical connector assembly 30 comprises a metal receptacle 32 comprising a suitable good electrically conductive material such, for example, as copper, silver, aluminum, and the like. Additionally, the receptacle 32 may comprise a material such, for example, as steel coated with a suitably good electrically conducting material.

The metal electrical receptacle 32 is disposed in a portion of a support member 34 of a semiconductor device. The support member 34 is usually employed as an electrical conductor for one region of semiconductor element mounted on the member 34. Therefore, the receptacle 32 is electrically insulated from the member 34 by a layer 36 of a suitable electrical insulating material.

The receptacle 32 has a centrally disposed cavity 38 having tapered side walls. An electrical lead 40 from the semiconductor element and comprising a good electrically conducting metal is disposed within the cavity 38. A pin 42, comprising a good electrically conducting metal, such, for example, as silver, aluminum, or copper and copper base alloys, and having a wedge shaped, or tapered,, end 44 is inserted into the cavity and wedges the lead 40 between the surface of the tapered end 44 and the surface of the cavity 38. Electrical conductivity is achieved between the contiguous surfaces of the lead 40 and the wedge shaped, or tapered, end 44 of the pin 42 as well as through an electrical circuit consisting of the lead 40, the receptacle 32 and the tapered end 44 of the pin 42.

With reference to FIG. 3, there is shown an alternate configuration for the pin 42 of the solderless connector assembly 30. The tapered end 44 of the pin 42 has a plurality of flutes 46 formed in the tapered surface. When the pin 42 is forced into the cavity 38 containing the lead 40, the end of the lead 40 moves enough to align itself between the tapered wall surface of the cavity 38 and the curved surface of one of the flutes 46 of the pin 42. The result of this wedging action is to provide more surface contact area between the lead 40 and the pin 42 in order to assume one of having a good electrical connection between the components.

Additionally, the flutes 46 may also be formed as a spiral on the tapered end 44 or as a series of concentric rings spaced vertically apart from each other.

With reference to FIG. 4, there is shown an electrical device 100 embodying the solderless electrical connector assembly 30. The device 100 comprises the support member 34 which has good electrical and thermal conductivity properties. The support member 34 is made of a metal selected from the group consisting of copper, silver aluminum, base alloys thereof, and ferrous base alloys. Copper and brass, a base alloy of copper, have been found particularly satisfactory for this purpose. The support member 34 has an integral weld ring 102 about its outer peripheral portion and an upwardly extending pedestal portion 104.

A semiconductor element 106, suitably affixed to a back-up electrode 108 by suitable means, such, for example, as a layer of electrical solder, is inserted on an uppermost mounting surface 110 of the pedestal portion 104. The element 106 is retained on the pedestal portion 104 by preferably employing a layer of a suitable electrical solder joining the back-up electrode 108 to the uppermost mounting surface 110.

The semiconductor element 106 comprises at least two regions of semiconductivity. The lead 40 affixed to one region of the element 106 is terminated by disposing the free end of the lead 40 within the cavity 38 of the receptacle 32. The electrical connection to the other region of the element 106 is through the back-up electrode 108, the pedestal portion 104, the support member 34 and thence through a threaded portion 112 which is also employed for assembling the device 50 into electrical apparatus.

A header assembly 112 is joined to the member 34 hermetically sealing the semiconductor element 106 from the surrounding ambient. The header assembly 112 comprises a cup-shaped member 114 having an outwardly-extending flanged portion 116 and the pin 42 of the solderless electrical connector assembly 30 affixed to, but electrically insulated from, the member 114 by a bead 118 of a suitable electrically insulating material. The header assembly 112 is joined to the member 34 by welding the outwardly-extending flanged portion 116 to the weld ring 102.

When the header assembly 112 is attached to the member 34, the electrical connection between the lead 40 and the pin 42 is accomplished simultaneously. The insertion of the pin 42 into the receptacle 32 completes the electrical circuit as well as assisting in aligning the header assembly during fabrication. The header assembly 112 is designed to assure one that, during the heating and contracting of the components of the device 100 during operation, the pin 42 will be constantly wedging against the lead 40 and maintaining a good complete electrical circuit relationship between the affected components.

Referring now to FIG. 5, there is shown an electrical device 120 embodying an alternate configuration for the cup-shaped member 114 of the electrical device 100 of FIG. 4. The header assembly 112 now comprises a corrugated cup-shaped member 122 having an outwardly-extending flanged portion 132 welded to the annular weld ring 102.

The pin 42, as before, is retained by, and electrically insulated from the cup-shaped member 122 by the layer 118 of electrically insulating material.

The cup-shaped member 122 preferably comprises a suitable metal. However, a plastic material, or a ceramic material, and the like, may be utilized for fabricating the member 122. The member 122 is designed and constructed in such a manner that when the header assembly 112 is affixed to the support member 34 the wedge shaped, or tapered, end 44 of the pin 42 is constantly being urged into the receptacle 32 to assure a good electrical connection to the lead 40. The corrugations, or bellows, configuration of the member 122 provide the necessary force means for retaining the good electrical connection between the pin 42 and the lead 40 during operation of the electrical device.

With reference to FIG. 6, there is shown an electrical device 150 embodying an alternate configuration for both the header assembly 112 and the pin 42 of the solderless electrical connector assembly 30 of the electrical device 100 of FIG. 4. The pin 42 is modified to incorporate a radially outwardly-extending flanged portion 152. The flanged portion 152 preferably comprises the same electrically conductive material as the pin 42 and is either integral with, or suitably affixed to, the pin 42.

A header assembly 154 is joined to the support member 34 hermetically sealing the semiconductor element 106 from the surrounding ambient. The header assembly 154 comprises a cup-shaped member 156 having an outwardly-extending flanged portion 158. An electrical terminal 160 is affixed to the cup-shaped member 156. The terminal 160 has preferably a hollow tubular shape having one closed end and the other end having an outwardly-extending flanged portion 162. The terminal 160 comprises any suitable electrically conductive material such, for example, as gold, silver, aluminum, copper and base alloys thereof. The terminal 160 is electrically insulated from the member 156 by a layer 164 of suitable electrically insulating material which may also be the means of affixing the terminal 160 to the member.

An electrically conductive Belleville type spring washer 166 is disposed on the flanged portion 152 of the pin 42 and is in physical and electrical contact with the flanged portion 162 of the terminal 160. The pin 42 is free to move within the cavity of the terminal 160, the cavity providing a guiding means for directing the directional movement of the pin 42 during operation of the electrical device 150.

The header assembly 154 is joined to the member 34 by welding the outwardly-extending flanged portion 158 to the weld ring 102. When this welding operation is performed, the electrical connection between the lead 40, from the region of the element 106 to which the lead 40 is attached, and the pin 42, and the pin 42 and the terminal 160 is accomplished simultaneously. The electrically conductive spring washer 166 resiliently urges the pin 42 into a good electrical contact with the lead 40 by constantly exerting a force on the flange portion 152 which wedges the lead 40 between the tapered portion 44 of the pin 42 and the wall of the cavity 30 of the receptacle 36. A washer 166 also provides an electrical connection between the pin 42 and the terminal 160 and compensates for dimensional charges of component parts of the device 150 during its operation.

It is to be noted that more than one solderless electrical connector assembly may be employed in an electrical device.

Since certain changes in the product embodying the invention may be made without departing from its scope, it is intended that the accompanying description and drawings be interpreted as illustrative and not limiting.

I claim as my invention:

1. A solderless electrical connector assembly for semiconductor devices comprising:

(1) a pin, said pin comprising an electrically conductive material and having a wedge shaped end portion;

(2) an electrically conductive support member;

(3) a receptacle, said receptacle being disposed within said support member having a cavity disposed therein and adapted to receive the wedge shaped end portion of said pin; and (4) means for electrically insulating said pin from said support member.

2. The solderless electrical connector assembly of claim 1 in which the wedge shaped end portion of the pin is fluted.

3. An electrical device comprising:

(1) a thermally and electrically conductive support member;

(2) a semiconductor element disposed on a portion of said support member, said element having at least two regions of semiconductivity;

(3) a header assembly joined to said support and hermetically sealing said semiconductive element within said header assembly;

(4) at least one solderless electrical connector assembly comprising a pin comprising an electrically conductive material and having a wedge shaped end portion, and a receptacle disposed within a surface portion of said support member hermetically sealed within the header assembly, said receptacle having a cavity disposed therein and adapted to receive the wedge shaped end portion of said pin;

(5) an electrical lead electrically connected to said pin, one end of said lead connected to one region of semiconductivity of said semiconductor element and the other end disposed within the cavity of said receptacle and wedged between the wedge shaped end portion of said pin and the wall of the cavity of said receptacle; and (6) force means for continuously urging the wedged shaped end portion of said pin into the cavity of said receptacle to wedge said electrical lead between the wall of the cavity of said receptacle and the wedge shaped end portion of the pin.

4. The electrical device of claim 3 in which the wedge shaped end portion of the pin is fluted.

5. The electrical device of claim 3 in which the pin of the solderless electrical connector assembly is affixed to said header assembly.

6. The electrical device of claim 5 in which said receptacle comprises an electrically conductive material and said receptacle is electrically insulated from said support member.

7. The electrical device of claim 5 in which said header assembly comprises a cup-shaped bellows member to which said pin is affixed and said force means comprises said cup-shaped bellows member resiliently urging the wedge shaped end portion of said pin into the cavity of said receptable.

8. The electrical device of claim 4 in which said header assembly comprises in part an electrical connector, said electrical connector comprising a tubular member closed at one end and having an outwardly-extending flared portion at the other end, said pin having a radially outwardly extending shoulder disposed between the wedge shaped end portion of the pin and the end of the pin, the other end of the pin is slidably mounted within the tubular member, and said force means comprises an electrically conductive apertured spring washer disposed between, and in physical and electrical contact with, said shoulder of said pin and said flange portion of said terminal.

9. The electrical device of claim 8 in which said receptacle comprises an electrically conductive material and said receptacle is electrically insulated from said support means.

References Cited

UNITED STATES PATENTS

| | | | |
|---|---|---|---|
| 3,008,221 | 11/1961 | Uebelmann | 29—628 |
| 3,104,144 | 9/1963 | Sprole | 339—273 |
| 3,249,908 | 5/1966 | Fuller et al. | 174—84 |
| 3,311,798 | 3/1967 | Gray | 317—234 |
| 3,327,284 | 6/1967 | Crimmins | 29—628 |
| 3,405,382 | 10/1968 | Wright | 317—234 X |

JOHN W. HUCKERT, Primary Examiner

R. F. POLISSACK, Assistant Examiner

U.S. Cl. X.R.

29—628; 174—68.5, 84; 317—235; 339—273